(12) United States Patent
Kindt et al.

(10) Patent No.: US 11,778,134 B2
(45) Date of Patent: Oct. 3, 2023

(54) FAULT DETECTION CIRCUIT FOR IMAGE SENSOR

(71) Applicant: Teledyne DALSA B.V., Eindhoven (NL)

(72) Inventors: Willem J. Kindt, Berkel en Rodenrijs (NL); Hui-Yu Chen, Eindhoven (NL)

(73) Assignee: TELEDYNE DALSA B.V., Eindhoven (NL)

( * ) Notice: Subject to any disclaimer, the term of this patent is extended or adjusted under 35 U.S.C. 154(b) by 0 days.

(21) Appl. No.: 17/183,866

(22) Filed: Feb. 24, 2021

(65) Prior Publication Data

US 2021/0352224 A1 Nov. 11, 2021

(30) Foreign Application Priority Data

May 7, 2020 (EP) ..................................... 20173502

(51) Int. Cl.
*G01R 31/52* (2020.01)
*H04N 5/32* (2023.01)
*G01R 31/54* (2020.01)
*G01R 31/28* (2006.01)

(52) U.S. Cl.
CPC ........... *H04N 5/32* (2013.01); *G01R 31/2829* (2013.01); *G01R 31/52* (2020.01); *G01R 31/54* (2020.01)

(58) Field of Classification Search
CPC .. G01R 31/50–58; G01R 31/70; G01R 31/71; H04N 5/32
See application file for complete search history.

(56) References Cited

U.S. PATENT DOCUMENTS

| | | | | |
|---|---|---|---|---|
| 8,736,684 B1* | 5/2014 | Johansson | ............ | H04N 17/002 348/181 |
| 9,681,124 B2* | 6/2017 | Moesle | ............... | G01R 31/2639 |
| 10,455,171 B2* | 10/2019 | Johnson | ............... | H04N 5/3598 |
| 10,484,676 B2* | 11/2019 | Fei | ......................... | H04N 17/002 |
| 11,109,017 B2* | 8/2021 | Feekes | ........................ | H04N 5/05 |
| 11,122,259 B2* | 9/2021 | Zhan | ...................... | G01R 31/56 |
| 2013/0075584 A1* | 3/2013 | Yaghmai | ............... | H04N 17/002 250/208.1 |
| 2013/0083204 A1 | 4/2013 | Solhusvik et al. | | |

(Continued)

OTHER PUBLICATIONS

Extended European Search Report for European Application No. 20173502.4 dated Aug. 14, 2020, 8 pages.

*Primary Examiner* — Patrick Assouad
*Assistant Examiner* — Demetrius R Pretlow
(74) *Attorney, Agent, or Firm* — K&L Gates LLP (57) ABSTRACT

The present invention relates to a fault detection circuit for detecting one or more column faults in a pixel array of an image sensor. The present invention further relates to a readout circuit for reading out a column line of an image sensor, and to an image sensor comprising the same.

The fault detection circuit according to the invention comprises a signal unit for applying an electrical signal to a given column line of the pixel array, a determining unit for measuring a response to the applied electrical signal and for determining whether a fault exists for said given column line in dependence of the measured response, and a controller for controlling the signal unit and the determining unit, and for outputting a fault status for said given column line.

21 Claims, 3 Drawing Sheets

(56) References Cited

U.S. PATENT DOCUMENTS

| | | | |
|---|---|---|---|
| 2013/0093910 A1* | 4/2013 | Lee | H04N 5/376 |
| | | | 348/222.1 |
| 2016/0112700 A1* | 4/2016 | Fei | H04N 17/002 |
| | | | 324/750.3 |
| 2016/0366402 A1* | 12/2016 | Myers | H04N 5/367 |
| 2017/0213867 A1* | 7/2017 | Roos | H04N 25/68 |
| 2018/0213163 A1* | 7/2018 | Van Baarle | A61B 6/4233 |
| 2020/0154069 A1* | 5/2020 | Akavoor Sankaran | |
| | | | H04N 17/002 |
| 2021/0258563 A1* | 8/2021 | Zhan | H04N 5/378 |

* cited by examiner

FAULT DETECTION CIRCUIT FOR IMAGE SENSOR

The present invention relates to a fault detection circuit for detecting one or more column faults in a pixel array of an image sensor. The present invention further relates to a readout circuit for reading out a column line of an image sensor, and to an image sensor comprising the same.

Image sensors are known in the art. These sensors typically comprise a pixel array comprising a matrix of rows and columns of pixels, wherein each column of pixels is connected to a respective column line. Each pixel is provided with a photosensitive element such as a photoconductor or photodiode. The pixel is configured to generate a pixel signal in response to light or other electromagnetic radiation, e.g. X-rays, falling onto the image sensor. This signal is then fed to a column line, which in turn is connected to a readout unit that reads out the signal. The readout unit may comprise an analog-to-digital converter, 'ADC', for converting the analog pixel signal into a digital word that can be processed for generating an image.

Typically, multiple pixels are connected to the same column line. However, during operation, only one pixel at a time is allowed to output a pixel signal. This can for instance be achieved using row driver circuitry that is configured to select one row of pixels in the pixel array at a time to be read out.

The pixels in the pixel array can be active pixels in which the pixel signal is amplified or buffered before being put on the column line. Well known pixel layouts comprise the 3T and 4T pixel layouts. Alternatively, the pixels in the pixel array are passive pixels, for example pixels based on the well known 1T layout.

Image sensors can be manufactured in various technologies. For example, the pixel array can be realized in CMOS technology or TFT technology. The present invention is not limited to any of these technologies.

The readout unit may be provided as a readout integrated circuit, 'ROIC'. More in particular, the readout unit can be provided as a semiconductor die. Typically, multiple readout units are provided on the semiconductor die for simultaneously processing the pixel signals on a plurality of column lines.

An image sensor may comprise multiple ROICs. For example, an image sensor may comprise 1024 columns and a corresponding number of column lines. The pixel signals on these lines can be processed by 8 ROICs, each ROIC comprising 128 readout units.

The pixel array is typically mounted on a substrate or carrier that is non-transparent for the electromagnetic radiation, such as light or X-rays, that the pixel array should sense. On the backside of the substrate or carrier, a printed circuit board may be provided for processing the signals, e.g. digital words, which are generated by the ROICs and to provide control signals and/or power supply. Connection between the pixel array and the circuitry on the printed circuit board can be realized using flex-coils. The ROICs can in such case be mounted on a respective flex-coil.

Several different faults may exist in the pixel array or in the connection between the readout units and the column lines. For example, the column line may have a resistive short to a source of high or low potential. A connection between the readout unit and the column line, e.g. a bump connection, may be broken. In addition, adjacent column lines may be inadvertently connected to each other via a resistive short.

If there is a fault of some kind on the column line, the performance of the overall image sensor can be negatively affected. If there is a resistive short to a gate line corresponding to one of the transistors in the pixel array, the ROIC input pin, which is connected to the column line, can be drawn to a low potential. This may cause excessive currents. Also, the shorted gate line cannot be pulled to a high potential. Therefore, such resistive short is expected to cause both a row and a column failure.

Another potential problem is an input open. If the connection between the ROIC and the column line is broken, the column line will not capacitively load the ROIC input. The column line parasitic capacitance reduces the feedback factor for the charge amplifier circuitry inside the readout unit. In this manner, the column line parasitic capacitance is important to guarantee stability. With a disconnected column line, the corresponding readout unit may oscillate.

An object of the present invention is to provide a fault detection circuit that is capable of detecting one or more of the abovementioned faults.

According to the invention, this object is achieved using the fault detection circuit as defined in claim 1 that comprises a fault detection unit that is configured for detecting one or more column faults in a pixel array of an image sensor. The pixel array comprises a matrix of rows and columns of pixels, each column of pixels being connected to a respective column line.

The fault detection unit comprises a signal unit for applying an electrical signal to a given column line of the pixel array, a determining unit for measuring a response to the applied electrical signal and for determining whether a fault exists for said given column line in dependence of the measured response, and a controller for controlling the signal unit and the determining unit, and for outputting a fault status for said given column line.

By detecting a fault for a column line, the corresponding readout unit may be powered down, or the fault status can be taken into account when processing the output of the readout unit for the purpose of constructing an image.

The fault detection circuit may comprise a plurality of said fault detection units. The signal units and the determining units of the fault detection units may then correspond to respective column lines of the pixel array. In such case, the controllers of the plurality of the fault detection units may be combined into one or more main fault detection controllers. For example, for a pixel array having 1024 columns may be divided into 16 groups, each group comprising 64 column lines. The fault detection units of 64 column lines may be realized on a single semiconductor die, wherein the controllers of those fault detection units are combined in one main fault detection controller. In such case, the overall image sensor may then comprise 16 main fault detection controllers realized on 16 different semiconductor dies.

The fault detection circuit can be operable in a fault detection mode in which mode a fault status is determined for each associated column line, and an output mode for outputting the fault status for each associated column line. Here, an associated column line is a column line to which the fault detection circuit applies an electrical signal for the purpose of fault detection.

The fault detection circuit may comprise a memory for storing the fault status for each associated column line. Each fault detection unit may comprise a respective flip-flop for storing the fault status of the corresponding column line, wherein the flip-flops of the plurality of fault detection units are configured to cooperate as a shift register when the fault detection circuit is operating in the output mode for the purpose of outputting the fault status for each of the plurality of column lines.

The signal unit and determining unit of each fault detection unit may each be configured to determine at least one of a resistive short between the associated column line and a source of high potential, a resistive short between the associated column line and a source of low potential, a broken electrical connection between the fault detection unit and the associated column line, and a resistive short between the associated column line and an adjacent column line.

The signal unit of each fault detection unit may comprise a current source unit comprising one or more current sources, each current source being configured for sourcing or sinking a current to or from the column line associated with that signal unit. The corresponding determining unit may then be configured for measuring said response as an electrical response to the current(s) that is/are sourced or sunk by the one or more current sources in the current source unit.

Each fault detection unit may be operable in a first fault detection mode. In this mode, the controller controls the current source unit for sourcing a current to the column line. Furthermore, in this mode the determining unit is configured for measuring a voltage of the column line and for determining that a fault exists if the measured voltage is below a predefined first voltage. Typically, in this mode, the pixels that are connected to the column line under investigation are not selected for pixel read out. In such case, the column line should present a capacitive load for the signal unit. When sourcing a current, the capacitive load will accumulate charge and the voltage on the column line will rise. By comparing the voltage on the column line to a predefined voltage, e.g. half the supply voltage used in the fault detection circuit and/or readout unit, a decision can be made whether the column line presents a capacitive load, as expected, or comprises a resistive short to a source of low potential, e.g. ground. In this later case, the voltage on the column line will remain low. Preferably, the voltage on the column line is compared to the predefined voltage a predefined amount of time after starting the sourcing of currents. This amount of time should be sufficient to allow the voltage to rise above the predefined voltage in case the column line has no resistive short to a source of low potential.

Each fault detection unit may be operable in a second fault detection mode in which mode the controller controls the current source unit for sinking a current from the column line, and in which mode the determining unit is configured for measuring a voltage of the column line and for determining that a fault exists if the measured voltage is above a predefined second voltage.

If the column line has a resistive short to a source of high potential, then, despite sinking a current from the column line, the voltage on the column line will remain relatively high. By comparing the voltage on the column line to a predefined voltage, e.g. half the supply voltage used in the fault detection circuit and/or readout unit, a decision can be made whether the column line comprises a resistive short to a source of high potential, e.g. a supply or control line in the pixel array. Preferably, the voltage on the column line is compared to the predefined voltage a predefined amount of time after starting the sinking of currents. This amount of time should be sufficient to allow the voltage to drop below the predefined voltage in case the column line has no resistive short to a source of high potential.

Each fault detection unit may be operable in a third fault detection mode in which mode the controller controls the current source unit for first sourcing a current to the column line during a predefined first period and for subsequently sinking a current from the column line, and in which mode the determining unit is configured for measuring a voltage of the column line and determining that a fault exists if the measured voltage is below a predefined third voltage a predefined second time period after having initiated sinking the current. When the column line is properly connected, it will present a relatively high capacitance to the signal unit whereas if the connection is broken only a small capacitance is presented to the signal unit. By first sourcing a current during sufficient time, the capacitance will be charged up to a predefined voltage, e.g. the supply voltage of the fault detection unit and/or readout unit. Thereafter, a current will be sunk as a result of which the voltage on the column line will drop. When the voltage on the column line drops relatively quickly, a small capacitance is presented to the signal unit, which is indicative for a fault. When, a predefined time period after initiating the sinking of the current, the voltage on the column line is still relatively high, a relatively high capacitance is present and it can be assumed that the column line is properly connected.

Alternatively, when operating in the third fault detection mode, the controller controls the current source unit for first sinking a current from the column line during a predefined first period and for subsequently sourcing a current to the column line. In this case, the determining unit can be configured for measuring a voltage of the column line and determining that a fault exists if the measured voltage is above a predefined third voltage a predefined second time period after having initiated sourcing the current. At least one of the predefined first, second and third voltages and the predefined first and second time periods can be externally set via the control register. These values can for example be set by the circuitry on the printed circuit board to which the pixel array is connected.

The controllers of the plurality of fault detection units or the one or more main fault detection controllers can be configured to control the signal units and determining units corresponding to the plurality fault detection units substantially simultaneously. In this manner, the fault detection can be performed simultaneously for all connected column lines.

The plurality of column lines can be divided in a group of even column lines and a group of odd column lines. Each even column line is adjacent to a respective odd column line. The fault detection units can each be operable in a fourth fault detection mode in which mode the controller of a first fault detection unit that is coupled to an odd column line controls the current source unit to sink current and in which mode the controller of a second fault detection unit that is coupled to an adjacent even column line controls the current source unit to source current, or vice versa. The determining unit of the first and/or second fault detection unit can then be configured for determining that a resistive short exists between the odd and even column lines in dependence of the voltage measured for the odd column line and/or the voltage measured for the even column line. The current sunk can be larger than the current sourced. In this case, the determining unit corresponding to the current source that sources current can be configured to determine that a fault exists if the measured voltage is below a predefined fourth voltage. Alternatively, the current sunk can be smaller than the current sourced. In this case, the determining unit corresponding to the current source that sinks current can be configured to determine that a fault exists if the measured voltage is above a predefined fifth voltage.

According to a second aspect, the present invention provides a readout circuit for reading out a column line of an image sensor. The image sensor may comprise a matrix of rows and columns of pixels, wherein each column of pixels is connected to a respective column line.

The readout circuit comprises for each column line of the pixel array, a readout unit coupled to that column line. The readout unit comprises a reading unit configured for reading out a pixel signal of a pixel connected to that column line, and a controller for controlling the reading unit. The readout circuit further comprises a fault detection circuit as described above. For example, each readout unit can be associated with a respective fault detection unit.

The readout circuit can be integrated on one or more semiconductor dies, each semiconductor die being associated with a group of column lines among the plurality of column lines and comprising a respective fault detection unit and a respective readout unit for each of the associated column lines. In this case, the controllers of the readout units and/or the controllers of the fault detection units that are arranged on a same semiconductor die among the one or more semiconductor dies can be combined into a single controller.

According to a third aspect, the present invention provides an image sensor that comprises a pixel array having a matrix of rows and columns of pixels, wherein each column of pixels is connected to a respective column line. The image sensor further comprises the readout circuit as described above.

The image sensor may further comprise a processing unit for receiving and processing image data received from the readout unit and for controlling the readout unit. Furthermore, the image sensor may comprise a flex-coil for connecting the pixel array to the processing unit, wherein the one or more semiconductor dies are mounted to the flex-coil. The image sensor can be an X-ray sensor. Additionally or alternatively, the plurality of pixels may comprise active pixels, preferably pixels having a 3T or 4T layout, or passive pixels, preferably having a 1T layout.

Next, the present invention will be described in more detail referring to the appended figures, wherein.

Figure 1:
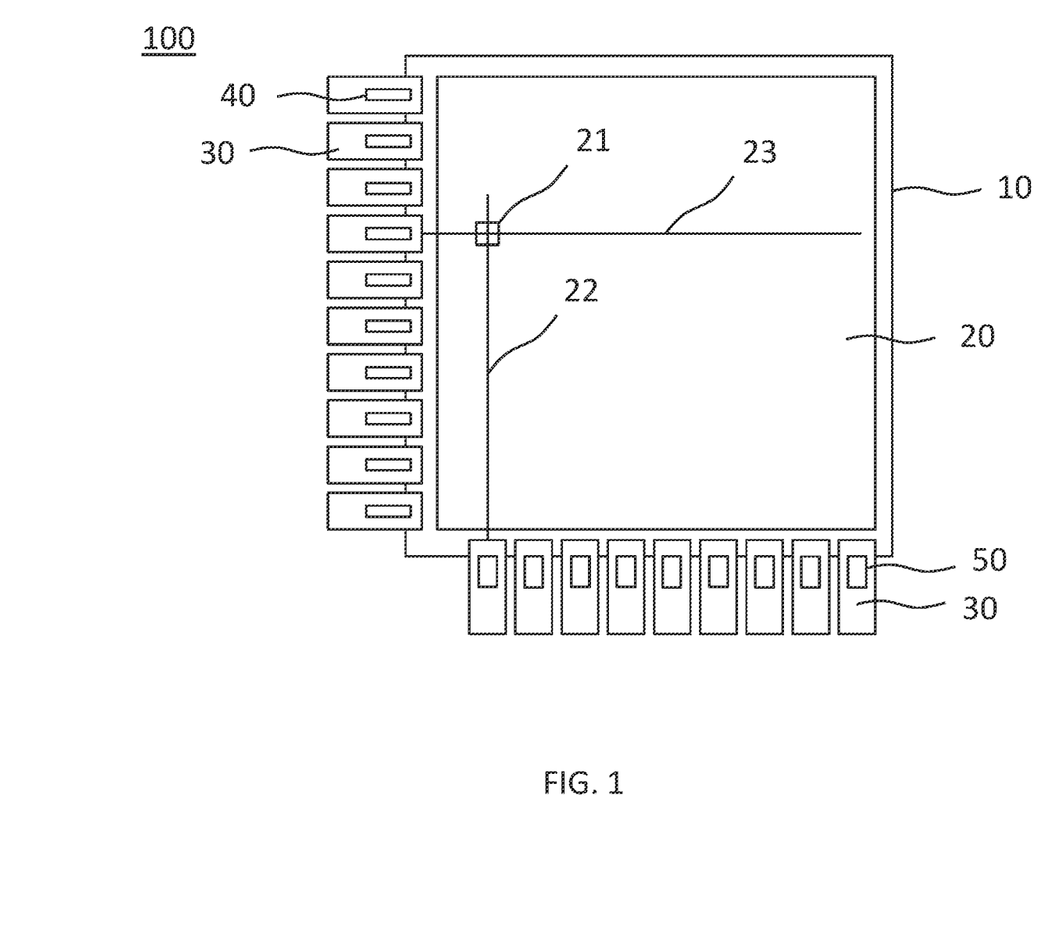
FIG. 1 illustrates a layout for an image sensor in accordance with the present invention.

In FIG. 1, a layout for an image sensor 100 in accordance with the present invention is schematically illustrated. Image sensor 100 comprises a carrier 10 on which a pixel array 20 is arranged. Pixel array 20 can be formed using one or more semiconductor tiles, for example CMOS tiles. Alternatively, pixel array 20 can be formed using a TFT panel.

Pixel array 20 comprises a plurality of pixels 21 (only one shown), for example pixels using a 3T or 4T layout. Such pixels are known in the art and a detailed analysis is therefore considered redundant. It should be noted that the image sensor could equally be based on passive pixels having a 1T layout.

Each pixel 21 is connected to various control lines 23 (only one shown) for controlling the operation of pixels 21. Furthermore, each pixel 21 is connected to a respective column line 22 (only one shown) for allowing a pixel signal to be read out.

The various control signals for controlling pixels 21 are provided using row drivers. These drives are implemented on a plurality of semiconductor dies 40 that are mounted on flex-foils 30, which foils are used to connect the row drivers to an external device, e.g. a further controller arranged on the backside of carrier 10.

Column lines 22 are connected to a readout circuit. This latter circuit comprises a plurality of readout units that are each connected to a respective column line 22. Readout units corresponding to a plurality of column lines 22 are combined on a single semiconductor die 50. For example, a single semiconductor die 50 could comprise readout units corresponding to for example 128, 256, or 512 column lines.

Figure 2:
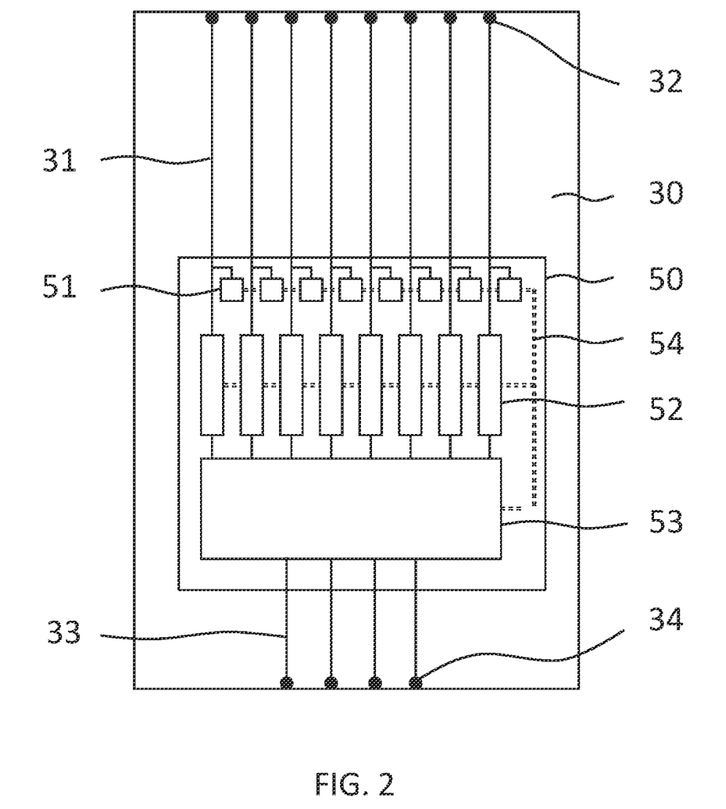
FIG. 2 illustrates a semiconductor die in accordance with the present invention on which a plurality of readout units and fault detection units are provided, which die is mounted on a flex-coil.

FIG. 2 illustrates a semiconductor die 50 mounted on a flex-foil 30 in accordance with the present invention. As illustrated, flex-foil 30 comprises a number of conductive tracks 31 that each correspond to a respective column line 22. Connection between flex-foil 30 and column lines 22 is achieved using connections 32. Typically, connections 32 are made with ACF bonding (anisotropic conductive film).

Semiconductor die 50 is flip-chip bonded onto flex-foil 30. For example, solder bumps or gold bumps can be used for connecting tracks 31 to semiconductor die 50. For illustrative purposes, these bumps are not illustrated in the schematic representation of FIG. 2.

On semiconductor die 50, fault detection units are arranged, which will be discussed in more detail referring to FIG. 3. Each fault detection unit comprises a signal unit for applying an electrical signal to its associated column line and a determining unit for measuring a response to the applied electrical signal and for determining whether a fault exists for the associated column line in dependence of the measured response. Each fault detection unit further comprises a controller for controlling the signal unit and the determining unit, and for outputting a fault status for the associated column line.

In FIG. 2, the signal unit and the determining unit are indicated using reference sign 51 and are hereinafter jointly referred to as SDU. On the other hand, the controllers of the various fault detection units are combined in a single controller that is referred to using reference sign 53.

In addition, semiconductor die 50 comprises readout units, each arranged for a respective column line 22. Each readout unit comprises a reading unit configured for reading out a pixel signal of a pixel connected to a respective column line, and a controller for controlling the reading unit. In FIG. 2, the reading unit is indicated using reference sign 52. The controllers of the various reading units are incorporated in controller 53.

Reading unit 52 may comprise an analog-to-digital converter, 'ADC', for converting analog pixel signals, either directly or after performing processing, into digital numbers. Controller 53 is configured for controlling the signal units and determining units 51 and for controlling reading units 52 via control lines 54. Controller 53 also gathers the digital numbers from reading units 52 and outputs the collected data.

Flex-foil 30 comprises conductive tracks 33 for transporting data to and from semiconductor die 50, and in particular to and from controller 53. For example, controller 53 sends the gathered data from reading units 52 to an external device for further processing. To that end, solder or gold bumps (not shown) enable a connection between outputs of controller 53 and conductive tracks 33 on flex-foil 30. Connection between tracks 33 and an external device is achieved using connections 34. Typically, connections 34 are made by inserting conductive tracks 33 into a flex-foil connector, typically a ZIF connector (zero insertion force). To this end, the end of conductive tracks 33 is laid-out with gold-coated copper tracks of the appropriate width and pitch to fit into said connector.

In an embodiment, circuitry is arranged on the backside of carrier 10. This circuitry is arranged for controlling the row drivers and controllers 53, and for processing the data sent by controllers 53. Furthermore, the circuitry can be realized using one or more printed circuit boards.

At least pixel array 20 can be covered by a scintillator layer for converting incoming X-ray photons into infrared, ultraviolet, or visible light photons. These latter photons can be detected by the photodiodes of pixels 21. Carrier 10 itself is typically made from aluminum. In some cases a dedicated X-ray blocking material is not necessary because most of the X-rays are absorbed in the scintillator on top of the detector. In other cases, where this does not suffice, a lead plate is used to absorb the remainder of the X-rays. This provides additional radiation shielding for the electronics and also is better from a radiation safety/operator safety point of view. It should be appreciated that the present invention equally applies to image sensors for sensing infrared, ultraviolet, or visible light. In such case, carrier 10 could be made from different material if desired and the scintillator layer could be omitted.

Figure 3:
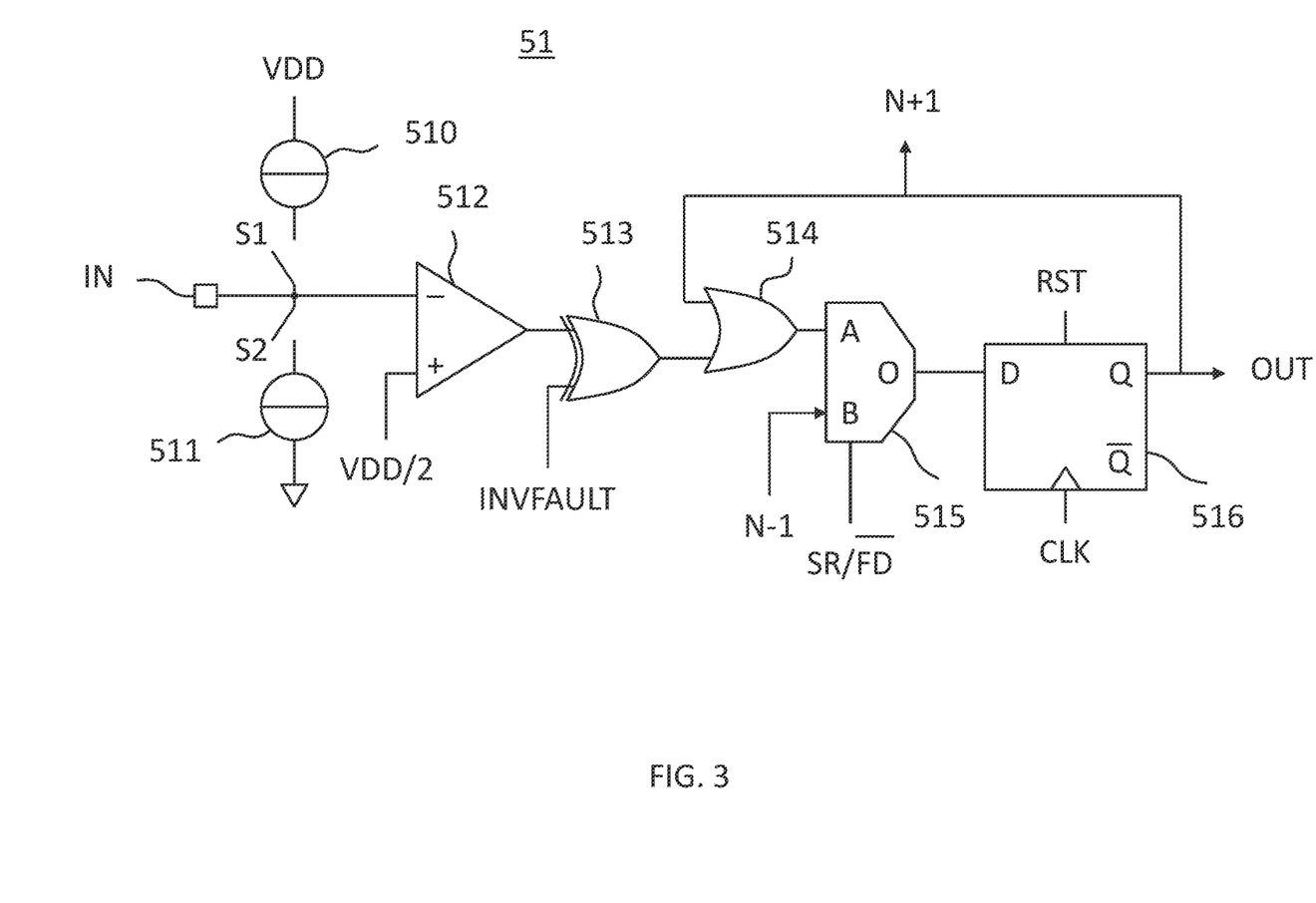
FIG. 3 illustrates an embodiment of a signal unit and a determination unit of a fault detection unit in accordance with the present invention.

FIG. 3 illustrates an embodiment of a SDU 51 in accordance with the present invention. SDUs 51 are connected in a serial manner. For example, SDU 51 shown in FIG. 3 is connected to a previous SDU, indicated as N−1, and to a next SDU, indicated as N+1. In some embodiments, the last SDU on a given semiconductor die 50 is connected to a first SDU on an adjacent semiconductor die 50 to obtain a serial connection of all SDUs for all column lines 22 of pixel array 20.

SDU 51 comprises a current source 510 that is connected, via a switch S1, to an input IN of SDU 51. SDU 51 further comprises a current source 511 that is connected, via a switch S2, to input IN. Current sources 510, 511 are configured for sourcing or sinking a current from or to input IN. Input IN is connected, via a respective track 31 and connection 32, to a respective column line 22.

SDU 51 comprises a comparator 512 having an inverting terminal connected to input IN. The non-inverting input is connected to a reference voltage, which in FIG. 3 equals half the supply voltage VDD/2 of semiconductor die 50.

The output of comparator 512 is connected to a first input of an exclusive OR gate 513. The other input of exclusive OR gate 513 is connected to an input terminal for receiving, for example from controller 53, logic signal INVFAULT.

The output of exclusive OR gate 513 is connected to a first input of OR gate 514. The output of OR gate 514 is connected to a first input A of multiplexer 515. The second input B of multiplexer 515 is connected to a previous SDU as will be discussed next. Output O of multiplexer 515 is equal to input A or to input B based on logic control signal SR/FD(bar). This latter signal is high when SDU 51 is operating in a shift-register mode, e.g. SR=1, and low when SDU 51 is operating in fault detection mode, e.g. FD=1. When operating in the shift-register mode, output O equals input B, and when operating in the fault detection mode, output O equals input A.

Output O of multiplexer 515 is connected to an input D of a clocked D flip-flop 516. This latter flip-flop 516 comprises an asynchronous reset input RST, which is low active, a clock input CLK, a first output Q, and a second output equal to the logic inverse of output Q, i.e. Q(bar), which output is not connected. First output Q is connected to the second input of OR gate 514 and is furthermore connected to input B of multiplexer 515 of an adjacent next SDU N+1, if any. Similarly, input B of multiplexer 515 in FIG. 3 is connected to output Q of D flip-flop 516 of a previous SDU 51.

Next, the operation of SDU 51 will be described in more detail.

Semiconductor die 50, hereinafter referred to as readout integrated circuit, 'ROIC', is programmed through a Serial Programming Interface, hereinafter referred to as SPI interface. The SPI interface is used to read and write configuration bits to registers inside controller 53 inside the ROIC. The configuration bits control various functions inside the ROIC. SDU 51 is also controlled through the SPI interface and through controller 53 inside the ROIC. Typically, the SPI interface provides communication between circuitry on the backside of carrier 10, or another external device, and a plurality of ROICs.

An SPI interface is a typical control interface that operates using 4 signals, namely a chip-enable signal, a clock signal, a data-in signal and a data-out signal. These signals are transported using tracks 33 and are received at the chip-enable pin, clock pin, data-in pin, and data-out pin, of the ROIC, respectively The chip-enable signal determines whether a ROIC connected to the SPI bus is addressed or not. This pin can be used to connect multiple ROICs to the same SPI bus, where the clock, data-in and data-out signals are (optionally) shared, and only the chip-enable signal is dedicated to a single integrated circuit on the SPI bus. For example, in an image sensor having 1024 columns, 4 ROICs could be used each handling 256 column lines. In this example, the SPI bus could comprise 4 dedicated chip-enable lines, a single clock line, and a single date-in and data-out line.

The SPI interface works with a certain bus protocol. Typically, the first bit written to the chip is a read/write bit that determines whether a register is written to or read from. The next few bits on the interface are interpreted as a register address. The final bits are interpreted as the data to be written into that register or the data to be read from that register. In this manner a large amount of configuration bits can be stored inside the ROIC while the amount of bits transmitted across the SPI bus in a single operation remains limited, e.g. to 17 bits: 1 R/W bit, 8 register bits and 8 data bits.

If the ROIC is written to, it reads the data bits received at the data-in pin and stores them in flip-flops at the right (address) location inside controller 53. If the ROIC is read from, it outputs the contents of the data bits stored at the register address to the data-out pin in a serial manner synchronous with the clock signal applied to the clock pin.

SDU 51 will be controlled by control bits in the SPI register map. The control bits are as follows:

Fdet_Isrc_en_odd: enable sourcing current series S1 switch in odd columns;

Fdet_Isrc_en_even: enable sourcing current series S1 switch in even columns;

Fdet_Isink_en_odd: enable sourcing current series S1 switch in odd columns;

Fdet_Isink_en_even: enable sourcing current series S1 switch in even columns;

Fdet_invfault_odd: invert the comparator output in the odd columns;

Fdet_invfault_even: invert the comparator output in the even columns;

Fdet_sr_fdb: equals a logic "1" if the fault detection unit works in shift-register (sr) mode, and equals a logic "0" if the fault detection unit works in a fault detection (fd) mode;

Fdet_pwr_en: equals a logic "1" if the fault detection unit is enabled, and equals "0" to power down the fault detection unit to save power;

Fdet_clk: a timing bit;

Fdet_rst_n: a bit for resetting the flip-flops in SDU 51;

In addition, the SPI register map contains a multi-bit register Fdet_timer, which is for instance an 8 bit register to program a time delay, as will be described below. To operate SDU 51, the external device, e.g. the controller on the backside of carrier 10, would issue the following commands through the SPI interface:

1. write a zero into the Fdet_timer register;
2. set Fdet_sr_fdb to "0" to operate the fault detection unit in fault detection mode, thereby allowing the output of multiplexer 515 to be equal to input A;
3. set Fdet_Isrc_en_odd and Fdet_Isrc_en_even both to "1" to turn on sourcing current source 510 for both odd and even column lines 22;
4. set Fdet_invfault_odd and Fdet_invfault_even both to "0" in order to invert the output of comparator 512;
5. wait for a certain time to allow the column line potential to settle before allowing comparator 512 to make a decision. If the voltage on input IN is higher than VDD/2, it is assumed that input IN, and therefore column line 22, is not shorted to a source of low potential. If the voltage is lower, a fault is assumed to be present. If the voltage on input IN is higher than VDD/2, the output of comparator 512 will be low, i.e. "0", and the output of exclusive OR 513 will be "0".
6. write a "1" into the Fdet_clk register bit. It is noted that the Fdet_clk register bit in the SPI register map operates in a non-standard manner. Most bits that are written with a "1" or a "0" will store that bit indefinitely for later read-back. However, when a "1" is written to Fdet_clk, controller 53 inside the ROIC will generate a short clock pulse CLK for D flip-flop 516. The Fdet_clk register will clear itself automatically.

Up to this point, the procedure has determined whether there is a short to a low potential and the result is stored in D flip-flop 516. More in particular, if a fault has been detected output Q will be at a high logic value, i.e. "1". The procedure continues with the following steps:

7. an appropriate value is written into the Fdet_timer register. This value corresponds to some desirable time delay.
8. set Fdet_Isrc_en_even and Fdet_Isrc_en_odd both to "0" for turning off sourcing current sources 510;
9. set Fdet_Isnk_en_even and Fdet_Isnk_en_odd both to "1" for turning on sinking current sources 511;
10. write a "1" into the Fdet_clk register. In this case, since the Fdet_timer register is not zero, controller 53 will not immediately generate a CLK pulse for D flip-flops 516. Rather, it will generate the CLK pulse after a time delay, which is exactly the desired functionality to sense the presence of a capacitor on input IN. More in particular, if the capacitive load to input IN, and therefore to column line 22, is low, which is indicative for column line 22 not being connected to a respective track 31, the voltage on input IN will drop relatively quickly. However, if the voltage does not drop quickly, a large capacitive loading is present that is indicative for column line 22 being properly connected. A low voltage on the inverting terminal of comparator 512, which is indicative for a fault, will result in the output of the comparator 512 being at a high level, i.e. "1". As INVFAULT was set to a low logic value under step 4, exclusive OR 513 will output a logic high value, i.e. "1", in case column lines 22 are not properly connected;

Up to this point in the procedure, it has been detected whether there are shorts to low potentials or whether column lines 22 are not correctly connected. The procedure continues with the following steps:

11. write a "0" into the Fdet_timer register;
12. set Fdet_invfault_odd and Fdet_invfault_even both to "1" to invert the results from comparator 512;
13. write a "1" into the Fdet_clk register such that controller 53 will immediately generate a clock pulse CLK for D flip-flops 516. Sinking current sources 511 were activated under step 9. In case, input IN, and therefore column line 22, was connected to a source of high potential, a high voltage would appear on input IN. If not, a low voltage would result. Hence, a low voltage fed to the inverting input of comparator 512, which would result in a high logical value at the output of comparator 512, is indicative of a no-fault condition. However, due to the setting under step 12, the values are inverted so that a high logical value at the output of comparator 512 implies a low logical value at the output of exclusive OR 513.

After completion of these steps, D flip-flop 516 contains a logic "1" if there is a short between input IN and a low potential, or if the capacitive loading of input IN indicates that column line 22 is not connected, or if there is a short between input IN and a high potential. The function of OR gate 514 is to 'logically combine' prior potential fault states with a new fault condition that is currently being tested In the procedure above, sourcing current sources 510 and sinking current sources 511 were operating in the same manner, either sourcing currents into column lines 22 or sinking currents from column lines 22. It is also possible to modify the above procedure and to simultaneously use sourcing currents in odd columns and sinking currents in even columns or vice versa to detect shorts between neighboring column lines 22.

For example, by enabling sourcing current source 510 of the fault detection unit corresponding to column line N and enabling sinking current source 511 of the fault detection unit corresponding to column line N−1, a short between column lines N and N−1 can be detected. More in particular, if the current that is sunk is larger than the current that is sourced, and if the voltage at input IN for column line N is low, a resistive short between column lines N−1 and N is assumed to be present. Hence, by setting INVFAULT for the fault detection unit for column line N to "0", exclusive OR 513 for column line N will output a high logical value in case the resistive short is detected. Similarly, if the current that is sunk is smaller than the current that is sourced, and if the voltage at input IN for column line N−1 is high, a resistive short is assumed to be present. Hence, by setting INVFAULT for the fault detection unit for column line N−1 to "1", exclusive OR 513 will output a high logical value in case the resistive short is detected. In this manner, the existence of a resistive short between column lines N and N−1 can be reflected in output Q of D flip-flop 516 for one of the column lines. More in particular, the fault can be detected using the fault detection unit that sourced or sank the smaller current.

The abovementioned procedure for checking for resistive shorts between adjacent column lines is preferably performed simultaneously for non-adjacent pairs.

A next step is to transmit the contents of D flip-flops 516 for each column line 22 to the outside world, more in particular the circuitry on the backside of carrier 10. For this purpose, the following SPI commands are to be generated:

14. write a logic "1" into the Fdet_sr_fdb control register bit. This bit configures the fault detecting units to operate in shift-register mode;
15. start a read operation on the SPI interface at a dedicated register address that is reserved for this purpose. Controller 53 knows that when an SPI read operation occurs at this address at a time when the Fdet_sr_fdb bit is "1", the contents of D flip-flops 516 should be transmitted on the data-out pin of the SPI interface.

The SPI interface has an 'auto address increment' feature. A typical SPI protocol enables the semiconductor die 50 using the chip-enable signal and subsequently bits are transmitted on the SPI bus, for example 17 bits comprising the read/write bit, the 8 register address bits and the 8 bits that contain the data to be written into the data-in pin or that are to be read from the data-out pin. The end of the bus transaction is indicated by the chip-enable signal being deactivated. In this special auto-increment mode, the controller on the backside of carrier 10 enables the chip-enable signal, then writes a "1" into the R/W bit to indicate that data is to be read, then it transmits the 8 bits pointing to address dedicated to the contents of the fault-detect flip-flop bits. After that, this controller keeps transmitting clock pulses. In a normal read operation that would be 8 clock pulses to read a byte, but now it will continue clocking for instance for 256 clock cycles to read 32 bytes of data. It is assumed that the data is coming from consecutive addresses in the register map.

For the fault detect units in particular, when controller 53 inside the ROIC observes a read transaction on the address reserved for the contents of D flip-flops 516, it will pass the clock from the SPI interface directly to the clock of D flip-flops 516. These flip-flops are now configured as a shift register so that the data bits will shift from column to column. The data bit appearing at the output of the last column is sensed by controller 53 and placed on the data-output pin of the SPI interface. In this manner, the contents of D flip-flops 516 are transmitted from the ROIC to the controller on the backside of carrier 10. Controller 53 can also apply the last outputted bit back to the input of the first flip-flop in the shift-register chain. This makes the read-out operation non-destructive.

Either controller 53 or the controller arranged on the backside of carrier 10 or other external device can use the information on the fault conditions of column lines 22 to de-active the readout units and optionally the fault detection units for which a fault condition was detected. This information can further be used by the external device when generating an image based on the digital words obtained for each column line.

The present invention has been explained using detailed embodiments thereof. However, the skilled person will readily appreciate that the invention is not limited to these embodiments but that various modifications are possible without deviating from the scope of the invention, which scope is defined by the appended claims.

The invention claimed is:

1. A fault detection circuit comprising a fault detection unit that is configured to detect one or more column faults in a pixel array of an image sensor, the pixel array comprising a matrix of rows and columns of pixels, each column of pixels being connected to a respective column line, the fault detection unit comprising:
   a signal unit configured to apply an electrical signal to a given column line of the pixel array;
   a determining unit configured to measure a response to the applied electrical signal and to determine whether a fault exists for said given column line in dependence of the measured response;
   a controller configured to control the signal unit and the determining unit, and to output a fault status for said given column line, wherein the controller comprises a control register; and
   the fault detection circuit comprises a plurality of the fault detection units, and wherein the signal unit of each of the plurality of fault detection units comprises a current source unit comprising a current source to sink or source a current to or from the column line associated with the signal unit, and the determining unit is configured to measure said response as an electrical response to the current that is sourced or sunk by the current source in the current source unit.

2. The fault detection circuit according to claim 1, wherein the controller of the fault detection units:
   are each addressable for receiving data into the control register;
   are each configured to control the corresponding signal unit(s) and determining unit(s) in dependence of control parameters stored in the control register; and
   wherein the fault detection circuit is operable in a fault detection mode in which mode a fault status is determined for each associated column line, and an output mode for outputting the fault status for each associated column line.

3. The fault detection circuit according to claim 1, wherein the fault detection circuit comprises a memory for storing the fault status for each associated column line;
   wherein each of the plurality of fault detection units comprises a respective flip-flop for storing the fault status of the corresponding column line, wherein the flip-flops of the plurality of fault detection units are configured to cooperate as a shift register when the fault detection circuit is operating in the output mode for the purpose of outputting the fault status for each of the plurality of column lines.

4. The fault detection circuit according to claim 1, wherein the signal units and the determining units of said plurality of fault detection units corresponding to respective column lines of the pixel array.

5. The fault detection circuit according to claim 4, wherein the signal unit and determining unit of each of the plurality of fault detection units are configured to determine at least one of:
   a resistive short between that column line and a source of high potential;
   a resistive short between that column line and a source of low potential;
   a broken electrical connection between the fault detection unit and the column line; and
   a resistive short between that column line and an adjacent column line.

6. The fault detection circuit according to claim 5, wherein each of the plurality of fault detection units are operable in a second fault detection mode in which mode the controller controls the current source unit for sinking a current from the column line, and in which mode the determining unit is configured for measuring a voltage of the column line and for determining that a fault exists if the measured voltage is above a predefined second voltage.

7. The fault detection circuit according to claim 5, wherein each of the plurality of fault detection units are operable in a third fault detection mode in which mode:

the controller controls the current source unit for first sourcing a current to the column line during a predefined first period and for subsequently sinking a current from the column line, and in which mode the determining unit is configured for measuring a voltage of the column line and determining that a fault exists if the measured voltage is below a predefined third voltage a predefined second time period after having initiated sinking the current; or the controller controls the current source unit for first sinking a current from the column line during a predefined first period and for subsequently sourcing a current to the column line, and in which mode the determining unit is configured for measuring a voltage of the column line and determining that a fault exists if the measured voltage is above a predefined third voltage a predefined second time period after having initiated sourcing the current.

8. The fault detection circuit according to claim 7, wherein the predefined third voltage and the predefined first and second time periods can be externally set via the control register.

9. The fault detection circuit according to claim 8, wherein the controller of the plurality of fault detection units are configured to control the signal units and determining units corresponding to the plurality of fault detection units substantially simultaneously.

10. The fault detection circuit according to claim 5, wherein the plurality of column lines is divided in a group of even column lines and a group of odd column lines, each even column line being adjacent to a respective odd column line, wherein each fault detection unit is operable in a fourth fault detection mode in which mode the controller of a first fault detection unit that is coupled to an odd column line controls the current source unit to sink current and in which mode the controller of a second fault detection unit that is coupled to an adjacent even column line controls the current source unit to source current, or vice versa, said determining unit of the first and/or second fault detection unit being configured for determining that a resistive short exists between the odd and even column lines in dependence of the voltage measured for the odd column line and/or the voltage measured for the even column line.

11. The fault detection circuit according to claim 10, wherein current that is sunk is larger than the current sourced, wherein the determining unit corresponding to the current source that sources current is configured to determine that a fault exists if the measured voltage is below a predefined fourth voltage; or wherein the current sunk is smaller than the current sourced, wherein the determining unit corresponding to the current source that sinks current is configured to determine that a fault exists if the measured voltage is above a predefined fifth voltage.

12. The fault detection circuit according to claim 5, wherein each fault detection unit is operable in a first fault detection mode in which mode the controller controls the current source unit for sourcing a current to the column line, and in which mode the determining unit is configured for measuring a voltage of the column line and for determining that a fault exists if the measured voltage is below a predefined first voltage.

13. A readout circuit for reading out a column line of an image sensor, said image sensor comprising a matrix of rows and columns of pixels, each column of pixels being connected to a respective column line, said readout circuit comprising for each column line of the pixel array, a readout unit coupled to that column line, said readout unit comprising a reading unit configured to read out a pixel signal of a pixel connected to that column line, and the controller configured to control the reading unit;

said readout circuit further comprising a fault detection circuit according to claim 1.

14. The readout circuit according to claim 13, wherein each readout unit is associated with a respective fault detection unit, and/or wherein the readout circuit is integrated on one or more semiconductor dies, each semiconductor die being associated with a group of column lines among the plurality of column lines and comprising a respective fault detection unit and a respective readout unit for each of the associated column lines, the controller of the readout units and/or the controller of the fault detection units that are arranged on a same semiconductor die among the one or more semiconductor dies being combined into a single controller.

15. An image sensor, comprising:

a pixel array comprising a matrix of rows and columns of pixels, each column of pixels being connected to a respective column line; and the readout circuit according to claim 13.

16. The image sensor according to claim 15, wherein each readout unit of the readout circuit is associated with a respective fault detection unit, and/or wherein the readout circuit is integrated on one or more semiconductor dies, each semiconductor die being associated with a group of column lines among the plurality of column lines and comprising a respective fault detection unit and a respective readout unit for each of the associated column lines, the controller of the readout units are arranged on a same semiconductor die among the one or more semiconductor dies being combined into the single controller.

17. The image sensor according to claim 16, further comprising a processing unit configured to receive and process image data received from the readout circuit and control the readout circuit, the image sensor further comprising a flex-coil configured to connect the pixel array to the processing unit, wherein the one or more semiconductor dies are mounted to the flex-foil.

18. The fault detection circuit according to claim 1, wherein the fault detection circuit comprises a plurality of said fault detection units, the signal units and the determining units of said fault detection units corresponding to respective column lines of the pixel array, wherein the controller of the plurality of fault detection units are combined into one or more main fault detection controller.

19. The fault detection circuit according to claim 16, wherein the controller of the one or more main fault detection controller are configured to control the signal units and determining units corresponding to the plurality of fault detection units substantially simultaneously.

20. The fault detection circuit according to claim 1, wherein the controller of the plurality of fault detection units are combined into at least one fault detection controller.

21. A fault detection circuit comprising a plurality of fault detection units, each fault detection unit of the plurality of fault detection units configured to detect one or more column faults in a pixel array of an image sensor, the pixel array comprising a matrix of rows and columns of pixels, each column of pixels being connected to a respective column line, the plurality of fault detection units comprising:
- a signal unit configured to apply an electrical signal to a given column line of the pixel array;
- a determining unit configured to measure a response to the applied electrical signal and to determine whether a fault exists for said given column line in dependence of the measured response; and
- a controller configured to control the signal unit and the determining unit, and to output a fault status for said given column line,
- the signal unit of each of the plurality of fault detection units comprises a current source unit comprising one or more current sources, each current source being configured for sourcing or sinking a current to or from the column line associated with that signal unit, and wherein the corresponding determining unit is configured for measuring said response as an electrical response to the current(s) that is/are sourced or sunk by the one or more current sources in the current source unit.

* * * * *